(12) United States Patent
Heo et al.

(10) Patent No.: US 10,355,232 B2
(45) Date of Patent: Jul. 16, 2019

(54) ORGANIC LIGHT EMITTING DISPLAY DEVICE HAVING BANK WITH BANKHOLE

(71) Applicant: LG DISPLAY CO., LTD., Seoul (KR)

(72) Inventors: JoonYoung Heo, Seoul (KR); KyungHoon Lee, Goyang-si (KR); Jang Jo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/688,079

(22) Filed: Aug. 28, 2017

(65) Prior Publication Data

US 2018/0062106 A1 Mar. 1, 2018

(30) Foreign Application Priority Data

Aug. 31, 2016 (KR) .................. 10-2016-0111882

(51) Int. Cl.
*H01L 27/32* (2006.01)
*H01L 51/52* (2006.01)
*H01L 21/02* (2006.01)
*H01L 51/50* (2006.01)

(52) U.S. Cl.
CPC .... *H01L 51/5203* (2013.01); *H01L 21/02008* (2013.01); *H01L 27/3246* (2013.01); *H01L 51/5012* (2013.01)

(58) Field of Classification Search
CPC ............. H01L 27/3246; H01L 27/3248; H01L 27/3283; H01L 27/3295; H01L 51/5012; H01L 51/5253
See application file for complete search history.

(56) References Cited

U.S. PATENT DOCUMENTS

2014/0151709 A1* 6/2014 Nishiyama .......... H01L 27/3211
257/72
2017/0117337 A1* 4/2017 Kimura ............... H01L 27/3246

* cited by examiner

*Primary Examiner* — Hoai V Pham
(74) *Attorney, Agent, or Firm* — Birch, Stewart, Kolasch & Birch, LLP

(57) ABSTRACT

Disclosed are an organic light emitting display device and a method of manufacturing the same, in which in a white organic light emitting device, an adverse influence of a leakage current leaked through an organic light emitting layer is minimized on an adjacent pixel. The organic light emitting display device includes a first electrode on a substrate, a bank covering a portion of the first electrode, a bank hole provided in the bank, an organic light emitting layer on the first electrode and the bank, and a second electrode on the organic light emitting layer.

16 Claims, 13 Drawing Sheets

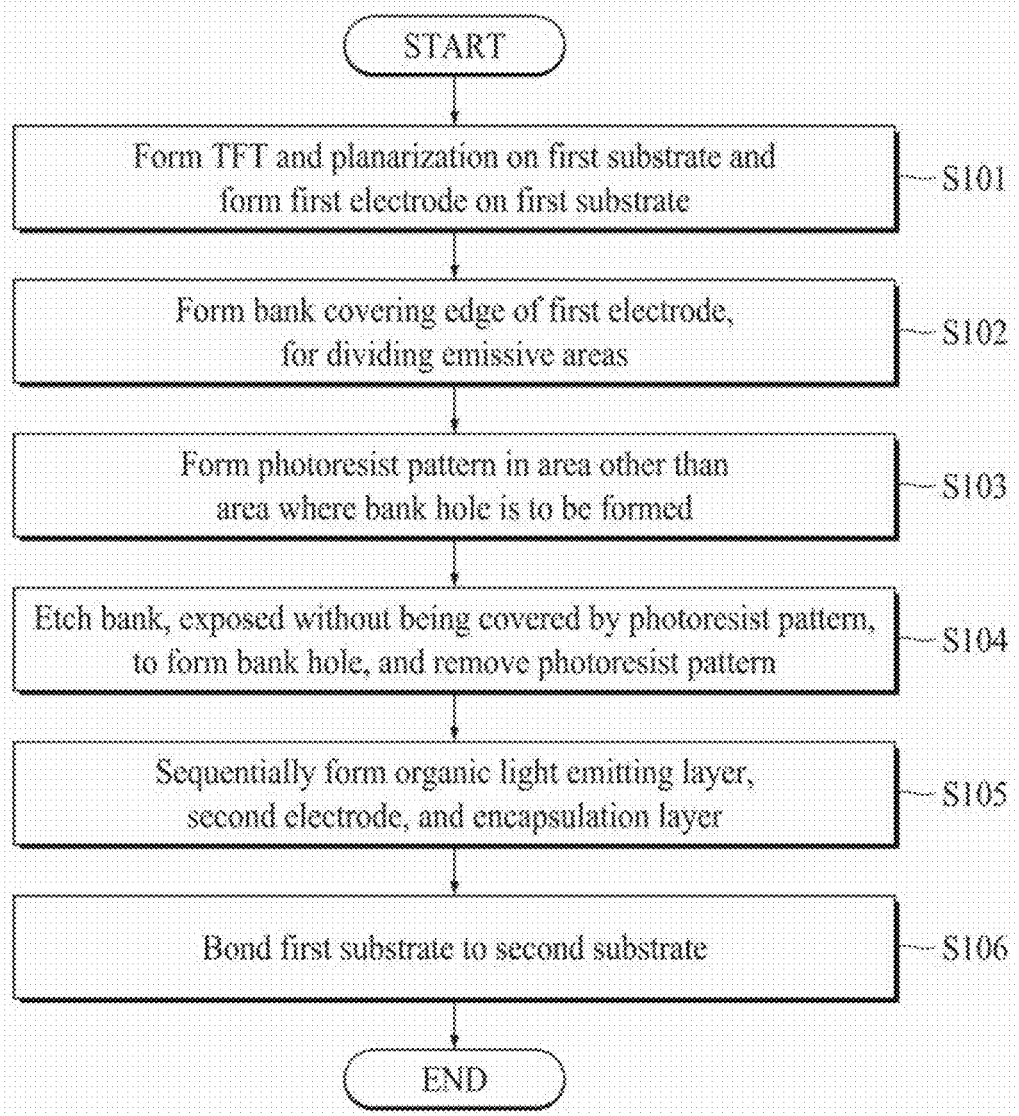

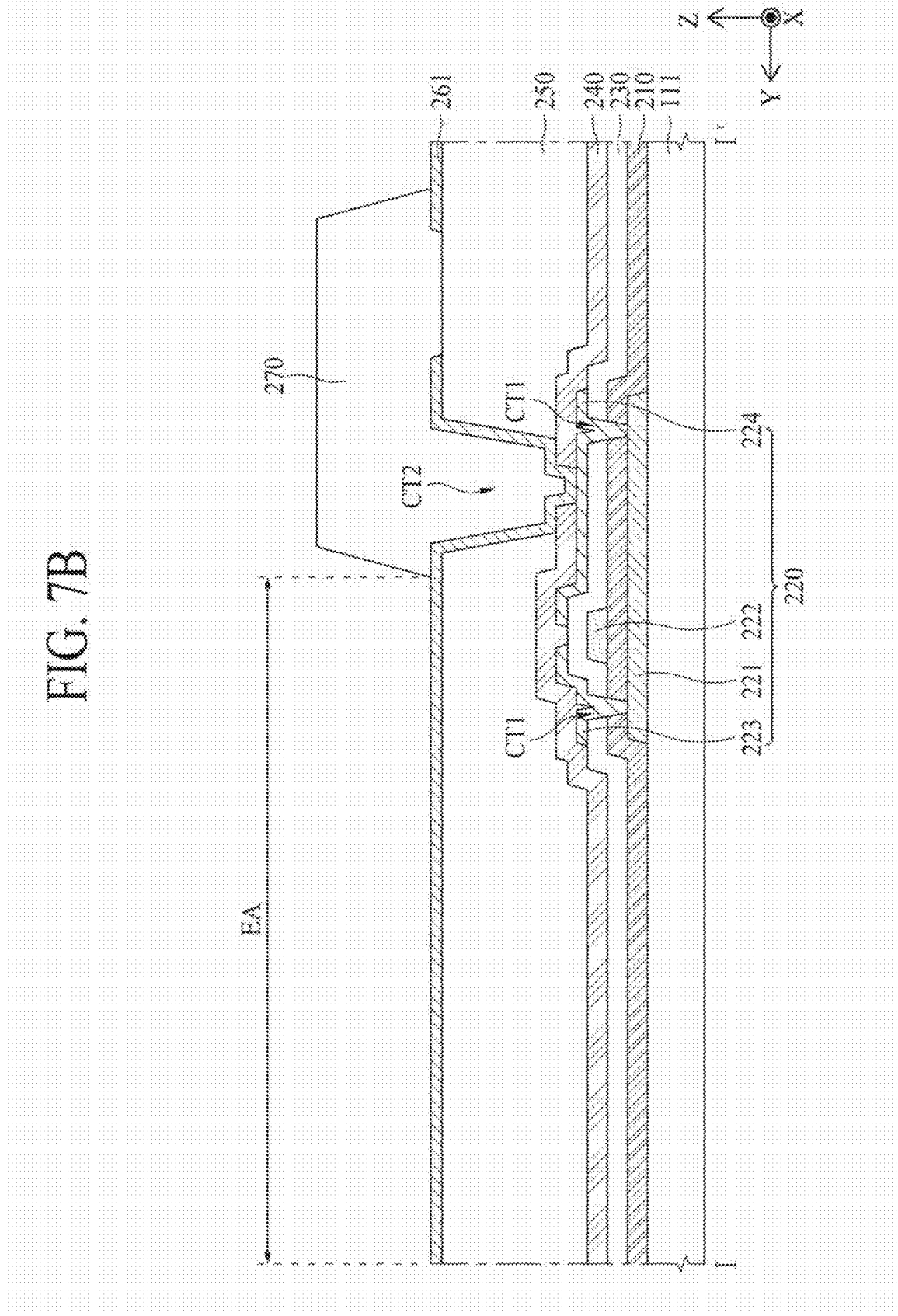

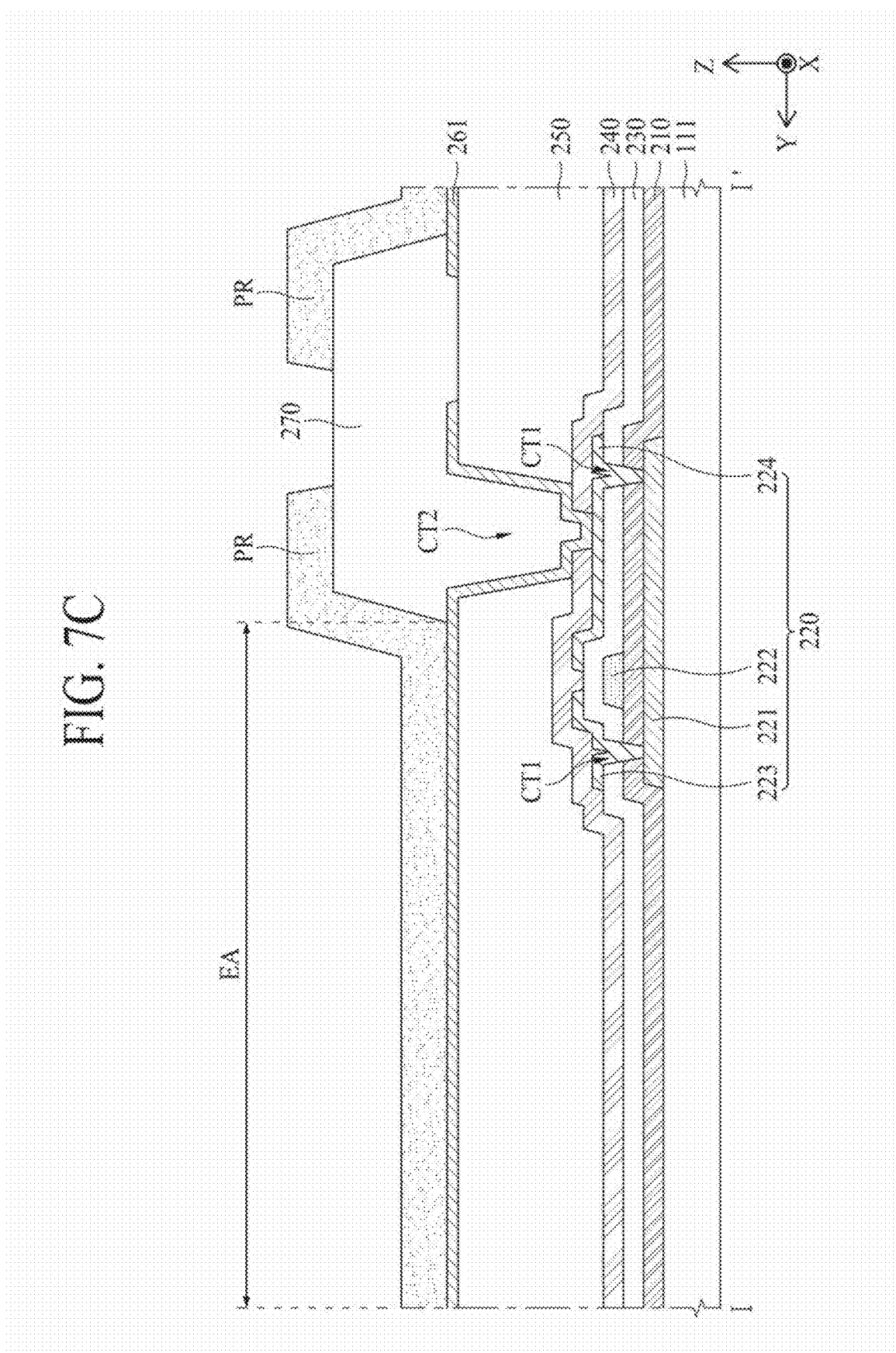

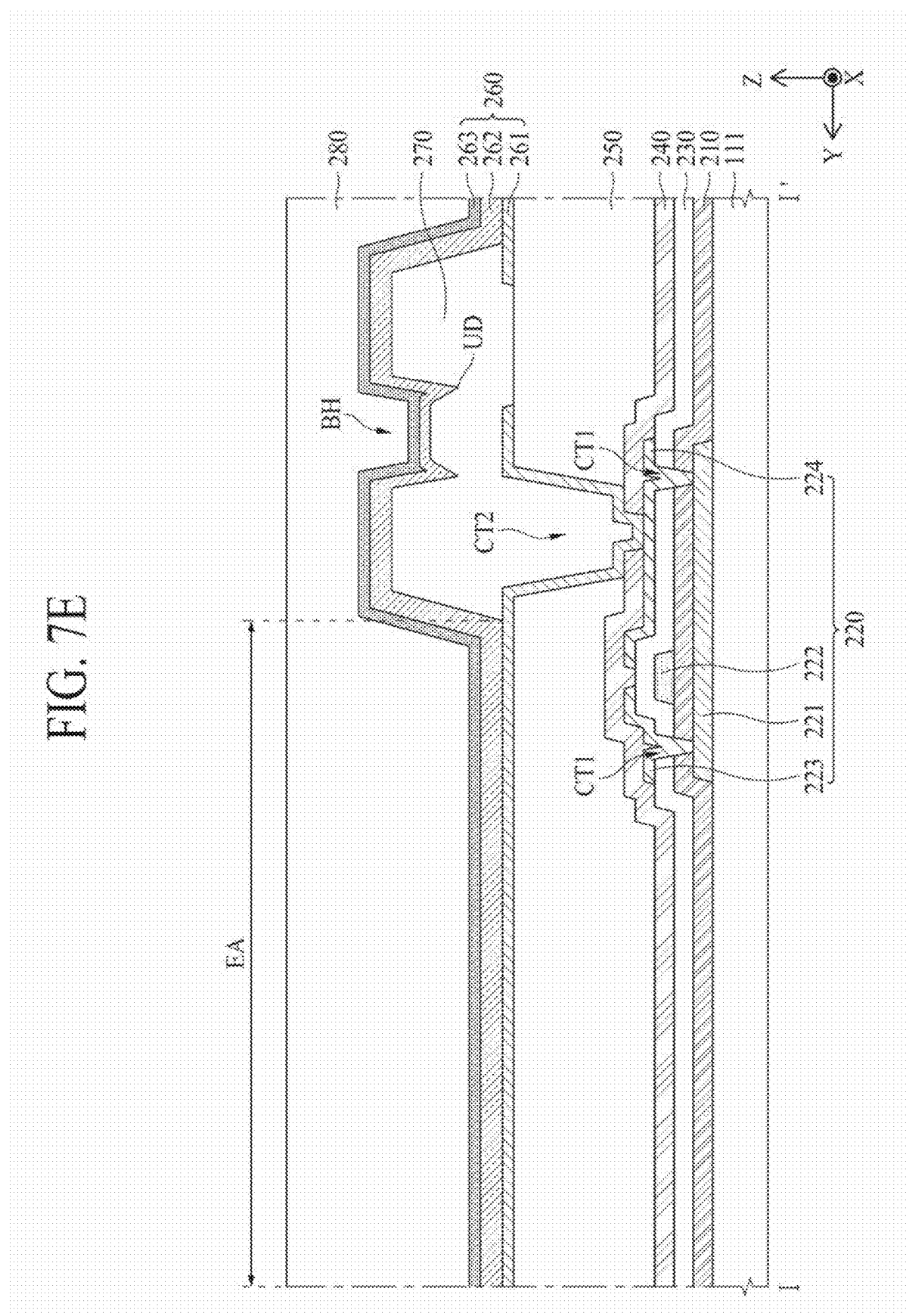

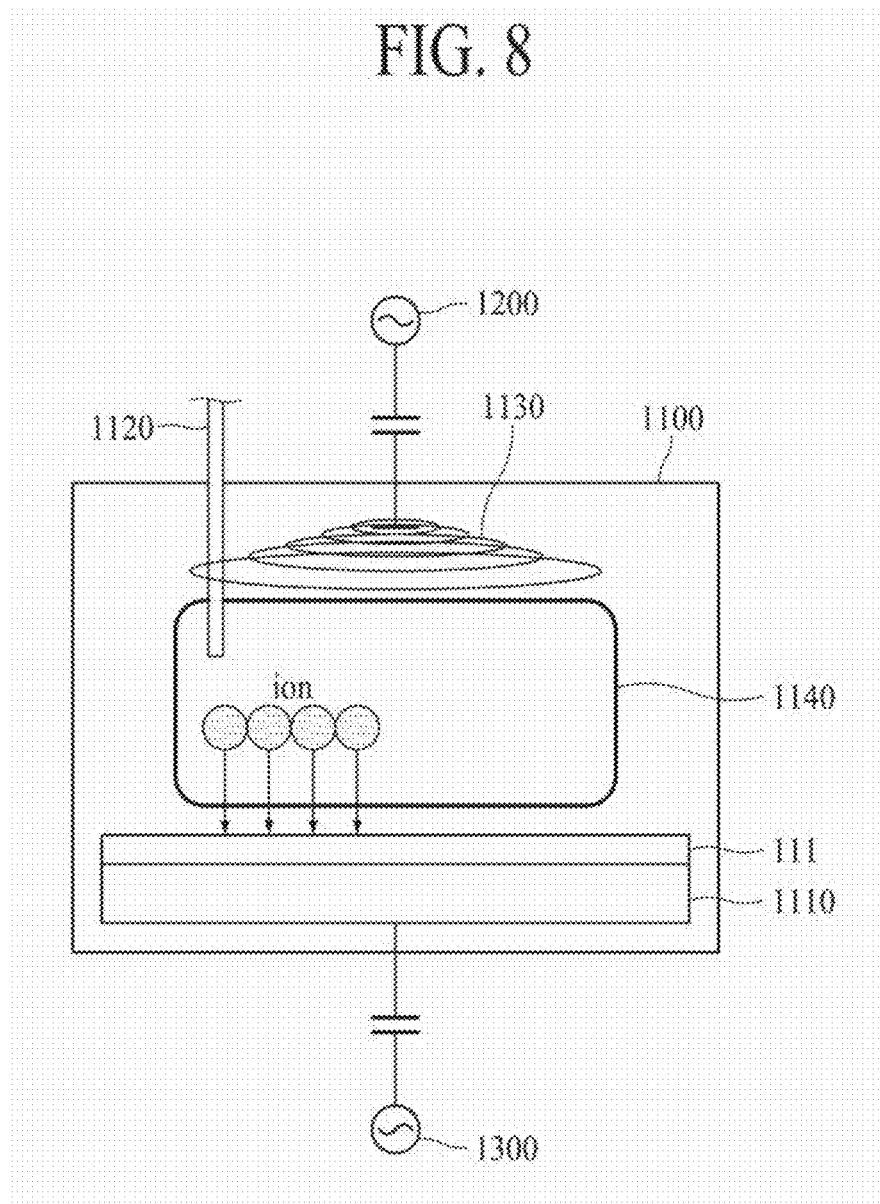

ORGANIC LIGHT EMITTING DISPLAY DEVICE HAVING BANK WITH BANKHOLE

CROSS-REFERENCE TO RELATED APPLICATIONS

This application claims the priority benefit of the Korean Patent Application No. 10-2016-0111882 filed on Aug. 31, 2016, the disclosure of which is incorporated herein by reference in its entirety.

BACKGROUND OF THE INVENTION

Field of the Invention

The present disclosure relates to an organic light emitting display device and a method of manufacturing the same.

Discussion of the Related Art

With the advancement of information-oriented society, various requirements for display devices for displaying an image are increasing. Therefore, various display devices such as liquid crystal display (LCD) devices, plasma display panel (PDP) devices, organic light emitting display devices, etc. are being used recently.

As a type of display device, organic light emitting display devices are self-emitting display devices and are better in viewing angle and contrast ratio than LCD devices. Also, since the organic light emitting display devices do not need a separate backlight, it is possible to lighten and thin the organic light emitting display devices, and the organic light emitting display devices are excellent in power consumption. Furthermore, the organic light emitting display devices are driven with a low direct current (DC) voltage, have a fast response time, and are low in manufacturing cost.

The organic light emitting display devices each include a plurality of pixels each including an organic light emitting device and a bank which divides the pixels for defining the pixels. The bank may act as a pixel defining layer. The organic light emitting device includes an anode electrode, a hole transporting layer, an organic light emitting layer, and an electron transporting layer, and a cathode electrode. In this instance, when a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light.

The organic light emitting device include a red organic light emitting device emitting red light, a green organic light emitting device emitting green light, and a blue organic light emitting device emitting blue light, or include only a white organic light emitting device emitting white light. If the organic light emitting device includes the white organic light emitting device, the organic light emitting layer and the cathode electrode may be provided in the pixels in common. That is, the organic light emitting layer and the cathode electrode may be connected to each other between adjacent pixels.

In order to enhance a color reproduction rate and emission efficiency, the white organic light emitting device may be provided in a tandem structure of two or more stacks where two or more organic light emitting layers are stacked. The tandem structure of two or more stacks needs a charge generating layer disposed between adjacent organic light emitting layers. However, in a structure where the organic light emitting layer and the cathode electrode are connected to each other between adjacent pixels, a current can leak from one pixel to an adjacent pixel due to the charge generating layer. That is, the adjacent pixel is affected by the leaked current. In this instance, the adjacent pixel cannot emit desired light due to the leaked current, causing a reduction in a color reproduction rate. Particularly, in high-resolution small display devices applied to virtual reality (VR) devices, smartphones, etc., an interval between pixels is narrow, and for this reason, the adjacent pixel is more affected by the leaked current.

SUMMARY OF THE INVENTION

Accordingly, the present disclosure is directed to provide an organic light emitting display device and a method of manufacturing the same that substantially obviate one or more problems due to limitations and disadvantages of the related art.

An aspect of the present disclosure is directed to provide an organic light emitting display device and a method of manufacturing the same, in which in a white organic light emitting device, an adverse influence of a leakage current leaked through an organic light emitting layer is minimized on an adjacent pixel Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including a first electrode on a substrate, a bank covering a portion of the first electrode, a bank hole provided in the bank, an organic light emitting layer on the first electrode and the bank, and a second electrode on the organic light emitting layer.

In another aspect of the present disclosure, there is provided a method of manufacturing an organic light emitting display device including forming a first electrode on a first substrate, forming a bank covering a portion of the first electrode, forming a photoresist pattern in an area other than an area where a bank hole is to be formed, forming the bank hole by etching an exposed bank uncovered by the photoresist pattern, removing the photoresist pattern, and sequentially forming an organic light emitting layer, a second electrode, and an encapsulation layer on the first electrode and the bank.

It is to be understood that the foregoing general description and the following detailed description of the present disclosure are by example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 6 is a flowchart illustrating a method of manufacturing an organic light emitting display device according to an embodiment of the present disclosure;

FIGS. 7A to 7F are cross-sectional views taken along line I-I' of FIG. 3 for describing a method of manufacturing an organic light emitting display device according to an embodiment of the present disclosure;

FIG. 8 is an example diagram illustrating a high frequency inductive coupled plasma apparatus for forming a bank hole area according to an embodiment of the present disclosure.

DETAILED DESCRIPTION OF THE EMBODIMENTS

Figure 1:
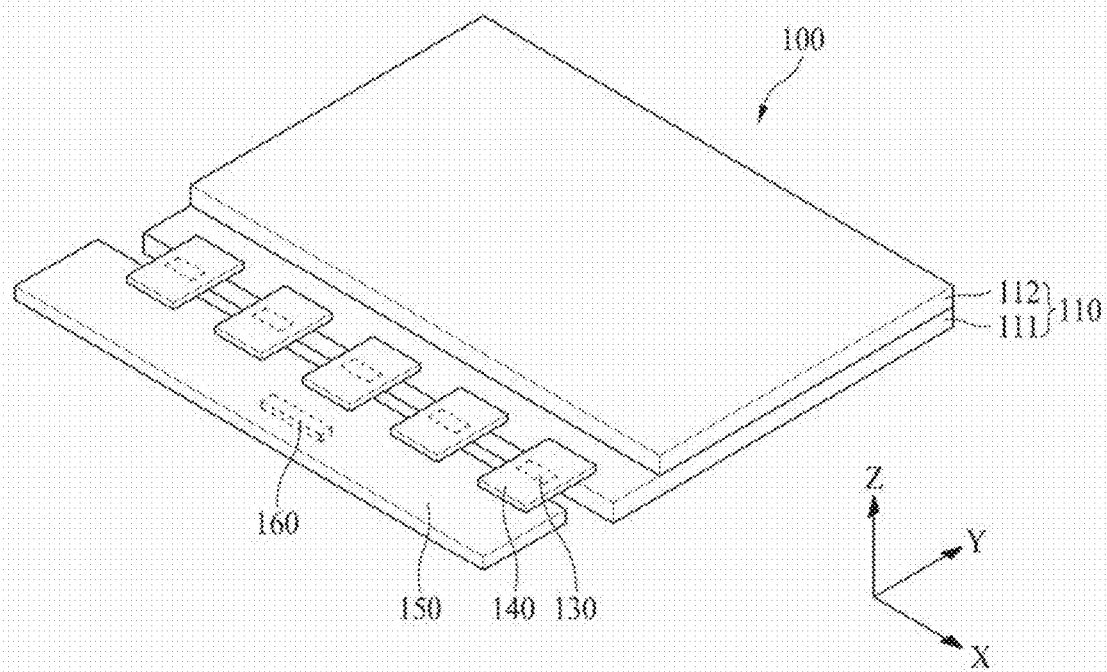
FIG. 1 is a perspective view illustrating an organic light emitting display device according to an embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In an instance where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, example embodiments of the present disclosure will be described in detail with reference to the accompanying drawings.

Figure 2:
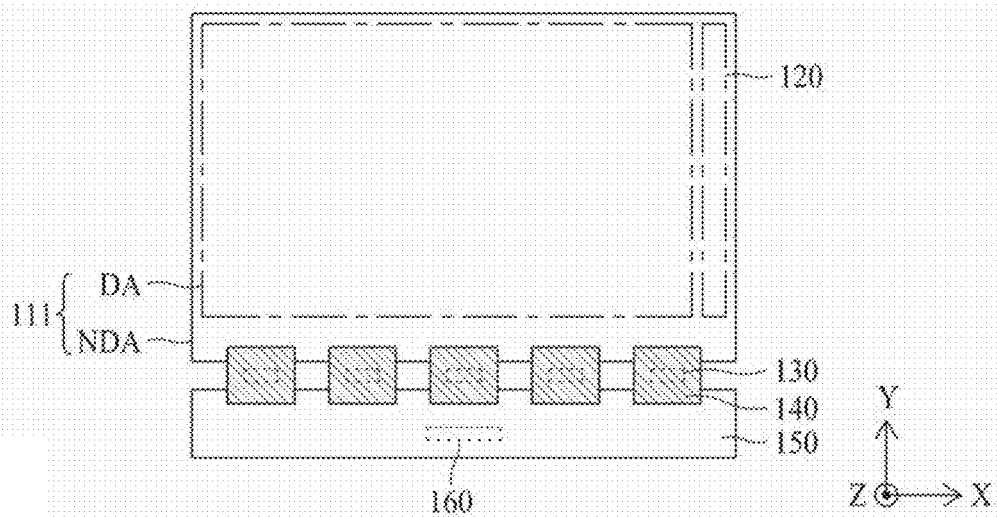
FIG. 2 is a plan view illustrating a first substrate, a gate driver, a source drive integrated circuit (IC), a flexible film, a circuit board, and a timing controller of FIG. 1.

FIG. 1 is a perspective view illustrating an organic light emitting display device 100 according to an embodiment of the present disclosure. FIG. 2 is a plan view illustrating a first substrate, a gate driver, a source drive integrated circuit (IC), a flexible film, a circuit board, and a timing controller of FIG. 1.

Referring to FIGS. 1 and 2, the organic light emitting display device 100 according to an embodiment of the present disclosure may include a display panel 110, a gate driver 120, a source drive IC 130, a flexible film 140, a circuit board 150, and a timing controller 160.

The display panel 110 may include a first substrate 111 and a second substrate 112. The second substrate 112 may be an encapsulation substrate. The first substrate 111 and the second substrate 112 may each be plastic, glass, or the like.

A plurality of gate lines, a plurality of data lines, and a plurality of pixels may be provided on one surface of the first substrate 111 facing the second substrate 112. The pixels may be respectively provided in a plurality of areas defined by an intersection structure of the gate lines and the date lines.

Each of the pixels may include a thin film transistor (TFT) and an organic light emitting device which includes a first electrode, an organic light emitting layer, and a second electrode. When a gate signal is input through a gate line, each of the pixels may supply a certain current to the organic light emitting device by using the TFT according to a data voltage supplied through a data line. Therefore, the organic light emitting device of each of the pixels may emit light having certain brightness according to the certain current. A structure of each of the pixels will be described in detail with reference to FIGS. 3 to 6.

The display panel 110, as illustrated in FIG. 2, may be divided into a display area DA, where the pixels are provided to display an image, and a non-display area NDA which does not display an image. The gate lines, the data lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110 in a gate driver-in panel (GIP) type. Alternatively, the gate driver 120 may be manufactured as a driving chip and may be mounted on a flexible film, and moreover, may be attached on the non-display area NDA outside the one side or the both sides of the display area DA of the display panel 110 in a tape automated bonding (TAB) type.

The source drive IC 130 may receive digital video data and a source control signal from the timing controller 160. The source driver IC 130 may convert the digital video data into analog data voltages according to the source control signal and may respectively supply the analog data voltages to the data lines. If the source drive IC 130 is manufactured as a driving chip, the source drive IC 130 may be mounted on the flexible film 140 in a chip-on film (COF) type or a chip-on plastic (COP) type.

A plurality of pads such as data pads may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads by using an anisotropic conductive film, and thus, the pads may be connected to the lines of the flexible film 140.

The circuit board 150 may be attached on the flexible film 140 which is provided in plurality. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board through a cable of the circuit board 150. The timing controller 160 may generate a gate control signal for controlling an operation timing of the gate driver 120 and a source control signal for controlling the source drive IC 130 which is provided in plurality, based on the timing signal. The timing controller 160 may supply the gate control signal to the gate driver 120 and may supply the source control signal to the plurality of source drive ICs 130.

Figure 3:
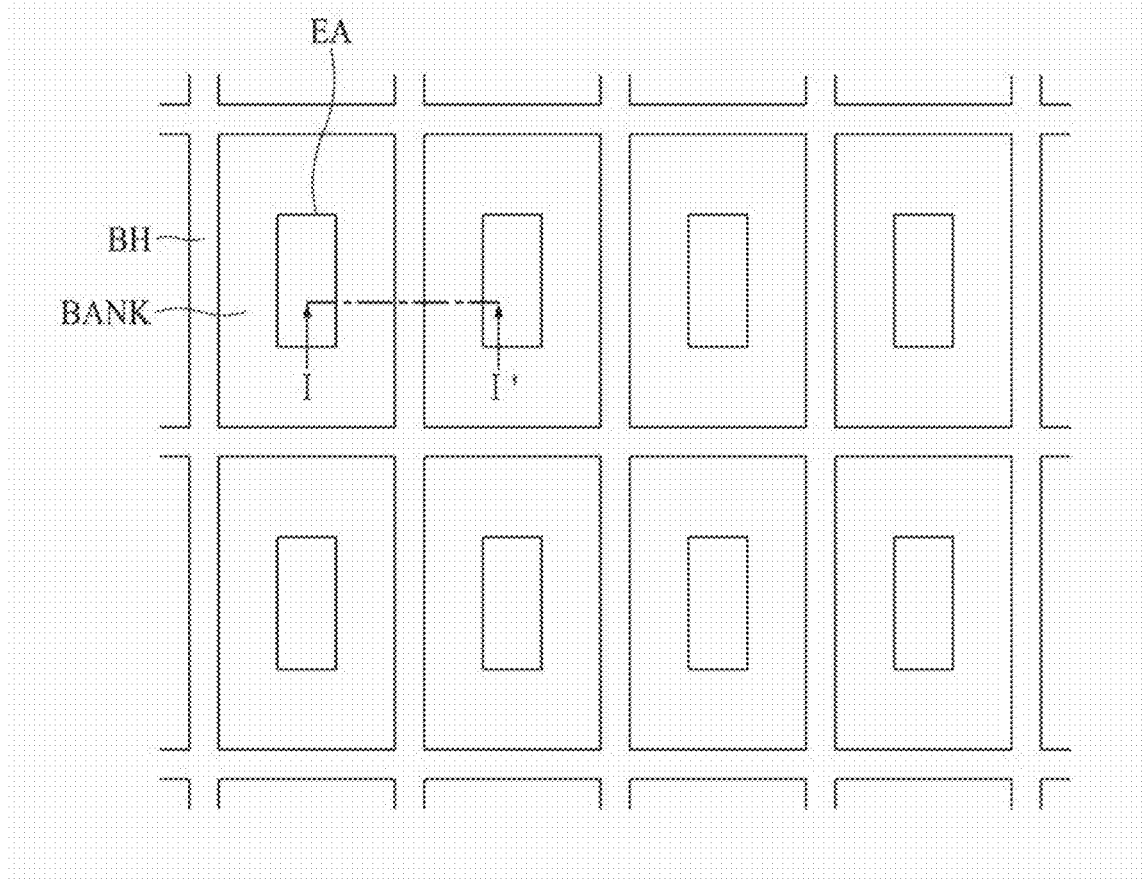
FIG. 3 is an example diagram illustrating a bank, a bank hole, and emissive areas of pixels in a display area according to an embodiment of the present disclosure.

FIG. 3 is an example diagram illustrating a bank, a bank hole, and emissive areas of pixels in a display area. In FIG. 3, for convenience of description, only a bank BANK, a bank hole BH, and emissive areas EA of pixels are illustrated.

Each of the pixels may include one emissive area. The emissive area may denote an area where a first electrode corresponding to an anode electrode, an organic light emitting layer, and a second electrode corresponding to a cathode electrode are sequentially stacked, and a hole from the first electrode and an electron from the second electrode are combined with each other in the organic light emitting layer to emit light.

The emissive area EA may be divided into a red emissive area which emits red light by using a red color filter, a green emissive area which emits green light by using a green color filter, a blue emissive area which emits blue light by using a blue color filter, and a white emissive area which emits white light without a color filter. A red pixel including the red emissive area, a green pixel including the green emissive area, a blue pixel including the blue emissive area, and a pixel including the white emissive area may be defined as one unit pixel.

The bank BANK may divide the emissive areas EA and may define the emissive areas EA. The bank BANK may be formed to surround each of the emissive areas EA. The bank hole BH corresponding to a recessed portion may be formed in the bank BANK. The bank hole BH may be formed between adjacent emissive areas EA.

Figure 4:
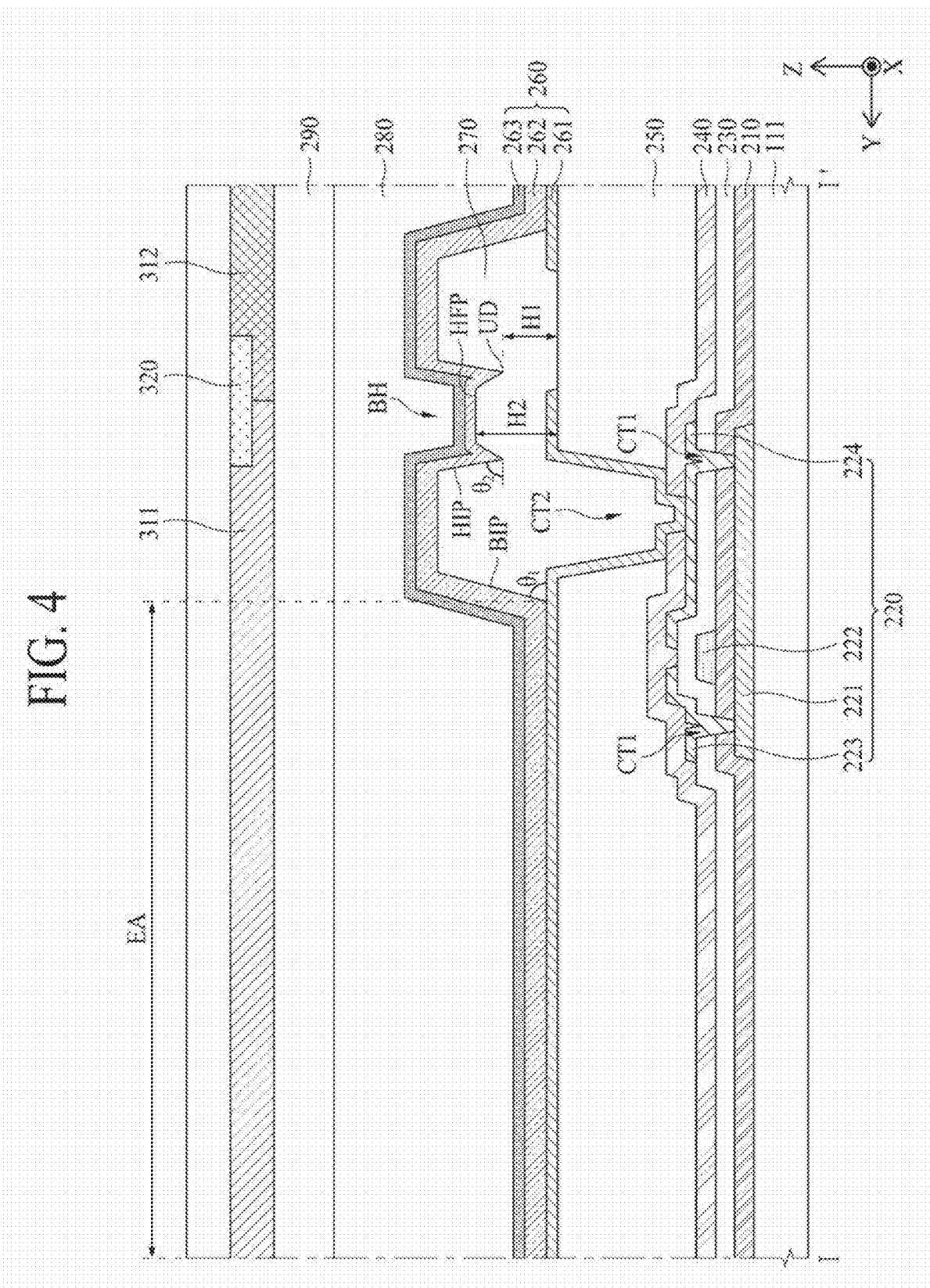
FIG. 4 is a cross-sectional view illustrating an example taken along line I-I' of FIG. 3.

FIG. 4 is a cross-sectional view illustrating an example taken along line I-I' of FIG. 3.

Referring to FIG. 4, a buffer layer may be formed on one surface of the first substrate 111 facing the second substrate 112. The buffer layer may be formed on the one surface of the first substrate 111, for protecting a plurality of TFTs 220 and a plurality of organic light emitting devices (or organic light emitting structures) 260 from water or moisture which penetrates through the first substrate 111 vulnerable to penetration of water. The buffer layer may include a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted.

The TFTs 220 may be formed on the buffer layer. Each of the TFTs 220 may include an active layer 221, a gate electrode 222, a source electrode 223, and a drain electrode 224. In FIG. 4, the TFTs 220 are exemplarily illustrated as being formed in a top gate type where the gate electrode 222 is disposed on the active layer 221, but is not limited thereto. In other embodiments, the TFTs 220 may be formed in a bottom gate type where the gate electrode 222 is disposed under the active layer 221 or a double gate type where the gate electrode 222 is disposed both on and under the active layer 221.

The active layer 221 may be formed on the buffer layer. The active layer 221 may be formed of a silicon-based semiconductor material or an oxide-based semiconductor material. A light blocking layer for blocking external light incident on the active layer 221 may be formed between the buffer layer and the active layer 221.

A gate insulation layer 210 may be formed on the active layer 221. The gate insulation layer 210 may be formed of an inorganic layer, for example, silicon oxide (SiOx), silicon nitride (SiNx), or a multilayer thereof.

The gate electrode 222 and a gate line may be formed on the gate insulation layer 210. The gate electrode 222 and the gate line may each be formed of a single layer or a multilayer which includes one of molybdenum (Mo), chromium (Cr), titanium (Ti), nickel (Ni), neodymium (Nd), and copper (Cu), or an alloy thereof.

An interlayer dielectric 230 may be formed on the gate electrode 222 and the gate line. The interlayer dielectric 230 may be formed of an inorganic layer, for example, SiOx, SiNx, or a multilayer thereof.

The source electrode 223, the drain electrode 224, and a data line may be formed on the interlayer dielectric 230.

Each of the source electrode 223 and the drain electrode 224 may contact the active layer 221 through a corresponding contact hole CT1 which passes through the gate insulation layer 210 and the interlayer dielectric 230. The source electrode 223, the drain electrode 224, and the data line may each be formed of a single layer or a multilayer which includes one of Mo, Cr, Ti, Ni, Nd, and Cu, or an alloy thereof.

A passivation layer 240 for insulating the TFTs 220 may be formed on the source electrode 223, the drain electrode 224, and the data line. The passivation layer 240 may be formed of an inorganic layer, for example, SiOx, SiNx, or a multilayer thereof.

A planarization layer 250 for planarizing a step height caused by the TFTs 220 may be formed on the passivation layer 240. The planarization layer 250 may be formed of an organic layer such as acryl resin, epoxy resin, phenolic resin, polyamide resin, polyimide resin, and/or the like.

An organic light emitting device 260 and a bank 270 may be formed on the planarization layer 250. The organic light emitting device 260 may include a first electrode 261, an organic light emitting layer 262, and a second electrode 263. The first electrode 261 may be an anode electrode, and the second electrode 263 may be a cathode electrode.

The first electrode 261 may be formed on the planarization layer 250. The first electrode 261 may be connected to the source electrode 223 of the TFT 220 through a contact hole which passes through the passivation layer 240 and the planarization layer 250. The first electrode 261 may be formed of a metal material, having a high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, and/or the like. The APC alloy may be an alloy of Ag, palladium (Pd), and Cu.

The bank 270 may be formed to cover a portion of the first electrode 261 on the planarization layer 250, for dividing the emissive areas EA. For example, the bank 270 may be formed to cover an edge of the first electrode 261. That is, the bank 270 may define the emissive areas EA. Also, an area where the bank 270 is provided may not emit light, and thus, may correspond to a non-emissive area.

A bank hole BH may be formed in the bank 270. The bank hole BH may include a sidewall HIP, a floor HFP, and an undercut portion UP between the sidewall HIP and the floor HFP. An inclined angle "$\theta_2$" of the sidewall HIP of the bank hole BH may be set greater than an inclined angle "$\theta_1$" of a side BIP of the bank 270. As the inclined angle "$\theta_2$" of the sidewall HIP of the bank hole BH gets closer to 90 degrees, a thickness of the organic light emitting layer 262 formed on the sidewall HIP of the bank hole BH may be thinned. As the thickness of the organic light emitting layer 262 is thinned, a resistance of the organic light emitting layer 262 increases, and thus, the amount of current leaked through the organic light emitting layer 262 is reduced.

Moreover, a height H1 of the undercut portion UP may be set lower than a height H2 of the floor HFP. That is, the undercut portion UP of the bank hole BH may be formed in an undercut shape so as to be deeper recessed than a center of the bank hole BH. As the height H1 of the undercut portion UP becomes lower than the height H2 of the floor HFP, a thickness of the organic light emitting layer 262 formed in the undercut portion UP may be thinned. As the thickness of the organic light emitting layer 262 is thinned, the resistance of the organic light emitting layer 262 increases, thereby the amount of current leaked through the organic light emitting layer 262 is reduced.

The bank 270 may be formed of an organic layer such as acryl resin, epoxy resin, phenolic resin, polyamide resin, polyimide resin, and/or the like.

The organic light emitting layer 262 may be formed on the first electrode 261 and the bank 270. The organic light emitting layer 262 may be a common layer which is formed in the emissive areas EA in common, and may be a white light emitting layer that emits white light. In this instance, the organic light emitting layer 262 may be formed in a tandem structure of two or more stacks. Each of the stacks may include a hole transporting layer, at least one light emitting layer, and an electron transporting layer.

Moreover, a charge generating layer may be formed between adjacent stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generating layer may be an organic layer which is formed by doping a dopant on an organic host material having an ability to transport holes.

The organic light emitting layer 262 may be formed in a deposition process or a solution process, and if the organic light emitting layer 262 is formed in the deposition process, the organic light emitting layer 262 may be formed in an evaporation process. A layer formed in the evaporation process is not good in step coverage characteristic. If the inclined angle "$\theta_2$" of the sidewall HIP of the bank hole BH is set greater than the inclined angle "$\theta_1$" of the side BIP of the bank 270, a thickness of the organic light emitting layer 262 on the sidewall HIP of the bank hole BH may be set thinner than that of the organic light emitting layer 262 on the side BIP of the bank 270.

That is, in an embodiment of the present disclosure, since the bank hole BH corresponding to a recessed portion is formed in the bank 270, a length of a current leakage path which passes through the organic light emitting display layer 262 between adjacent emissive areas EA may be set longer than an instance where the bank hole 270 is not provided. Also, in an embodiment of the present disclosure, since the inclined angle "$\theta_2$" of the sidewall HIP of the bank hole BH is set greater than the inclined angle "$\theta_1$" of the side BIP of the bank 270, a thickness of the organic light emitting layer 262 on the sidewall HIP of the bank hole BH may be set thinner than that of the organic light emitting layer 262 on the side BIP of the bank 270. Accordingly, in an embodiment of the present disclosure, the resistance of the organic light emitting layer 262 may increase, thereby an adverse influence of a leakage current leaked through the organic light emitting layer 262 is minimized on an adjacent pixel.

The second electrode 263 may be formed on the organic light emitting layer 262. The second electrode 263 may be a common layer which is formed in the emissive areas EA in common. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer may be formed on the second electrode 263.

The second electrode 263 may be formed in a physical vapor deposition (PVD) process such as a sputtering process. A layer formed in the PVD process such as the sputtering process is good in step coverage characteristic. Accordingly, despite the bank hole BH, the second electrode 263 may be deposited to have a uniform thickness in comparison with the organic light emitting layer 262.

An encapsulation layer 280 may be formed on the second electrode 263. The organic light emitting layer 262 and the second electrode 263 are formed in the bank hole BH. However, since the bank hole BH is not filled with the organic light emitting layer 262 and the second electrode 263, the encapsulation layer 280 may be formed to fill the bank hole BH.

The encapsulation layer 280 prevents oxygen or water from penetrating into the organic light emitting layer 262 and the second electrode 263. To this end, the encapsulation layer 280 may include at least one inorganic layer and at least one organic layer.

For example, the encapsulation layer 280 may include a first inorganic layer, an organic layer, and a second inorganic layer. In this instance, the first inorganic layer may be formed on the second electrode 263 to cover the second electrode 263. The organic layer may be formed on the first inorganic layer to cover the first inorganic layer. The organic layer may be formed to have a sufficient thickness for preventing particles from penetrating into the organic light emitting layer 262 and the second electrode 263 via the first inorganic layer. The second inorganic layer may be formed on the organic layer to cover the organic layer.

The first and second inorganic layers may each be formed of silicon nitride, aluminum nitride, zirconium nitride, titanium nitride, hafnium nitride, tantalum nitride, silicon oxide, aluminum oxide, titanium oxide, and/or the like. The organic layer may be formed of acryl resin, epoxy resin, phenolic resin, polyamide resin, polyimide resin, and/or the like.

A plurality of color filters 311 and 312 and a black matrix 320 may be formed on one surface of the second substrate 112 facing the first substrate 111. The color filters 311 and 312 may be disposed in an area corresponding to the emissive areas EA. The color filters 311 and 312 may each be formed of an organic layer including a certain pigment such as a red pigment, a green pigment, a blue pigment, and/or the like.

The black matrix 320 may be disposed between the color filters 311 and 312. The black matrix 320 may be provided in a non-emissive area instead of the emissive areas EA. The black matrix 300 may be formed of an organic layer including a black pigment.

The encapsulation layer 280 of the first substrate 111 may be adhered to the color filters 311 and 312 of the second substrate 112 by using an adhesive layer 290, and thus, the first substrate 111 may be bonded to the second substrate 112. The adhesive layer 290 may be a transparent adhesive resin.

As described above, in an embodiment of the present disclosure, since the bank hole BH corresponding to a recessed portion is formed on the bank 270, a length of a current leakage path which passes through the organic light emitting display layer 262 between adjacent emissive areas EA may be set longer than an instance where the bank hole 270 is not provided. Also, in an embodiment of the present disclosure, since the inclined angle "$\theta_2$" of sidewall HIP of the bank hole BH is set greater than the inclined angle "$\theta_1$" of the side BIP of the bank 270, a thickness of the organic light emitting layer 262 on the sidewall HIP of the bank hole BH may be set thinner than that of the organic light emitting layer 262 on the side BIP of the bank 270. Accordingly, in an embodiment of the present disclosure, the resistance of the organic light emitting layer 262 may increase, thereby an adverse influence of a leakage current leaked through the organic light emitting layer 262 is minimized on an adjacent pixel. In an embodiment of the present disclosure, the bank hole BH may be aligned with the black matrix 320.

Figure 5:
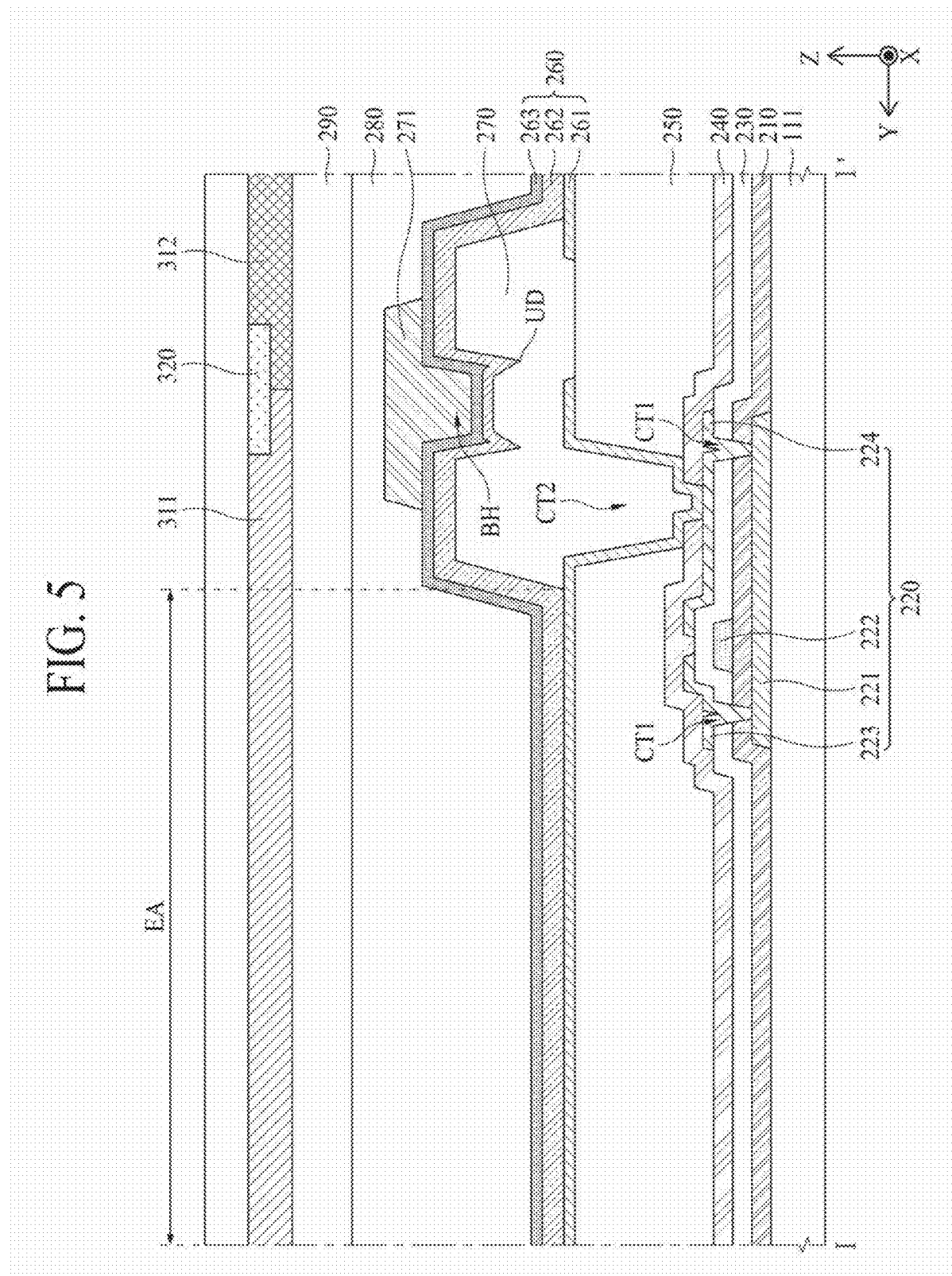
FIG. 5 is a cross-sectional view illustrating another example taken along line I-I' of FIG. 3.

FIG. 5 is a cross-sectional view illustrating another example taken along line I-I' of FIG. 3. Except that an organic light emitting display device further includes a black bank 271, an organic light emitting display device illustrated in FIG. 5 is substantially as described above with reference to FIG. 4.

The black bank 271 may be formed on a second electrode 263. The black bank 271 may be formed to fill a bank hole BH. If the black bank 271 is formed on the second electrode 263, the black matrix 320 may be omitted. The black bank 271 may be formed of an organic layer including a black pigment.

In an embodiment of the present disclosure, the black bank 271 blocks light traveling from one emissive area EA to an adjacent emissive area EA, thereby preventing occurrence of color mixture.

FIG. 6 is a flowchart illustrating a method of manufacturing an organic light emitting display device according to an embodiment of the present disclosure. FIGS. 7A to 7F are cross-sectional views taken along line I-I' for describing a method of manufacturing an organic light emitting display device according to an embodiment of the present disclosure.

The cross-sectional views illustrated in FIGS. 7A to 7F relate to the method of manufacturing the organic light emitting display device illustrated in FIG. 5, and thus, like reference numerals refer to like elements. Hereinafter, a method of manufacturing an organic light emitting display device according to an embodiment of the present disclosure will be described in detail with reference to FIGS. 6 and 7A to 7F.

Figure 7A:
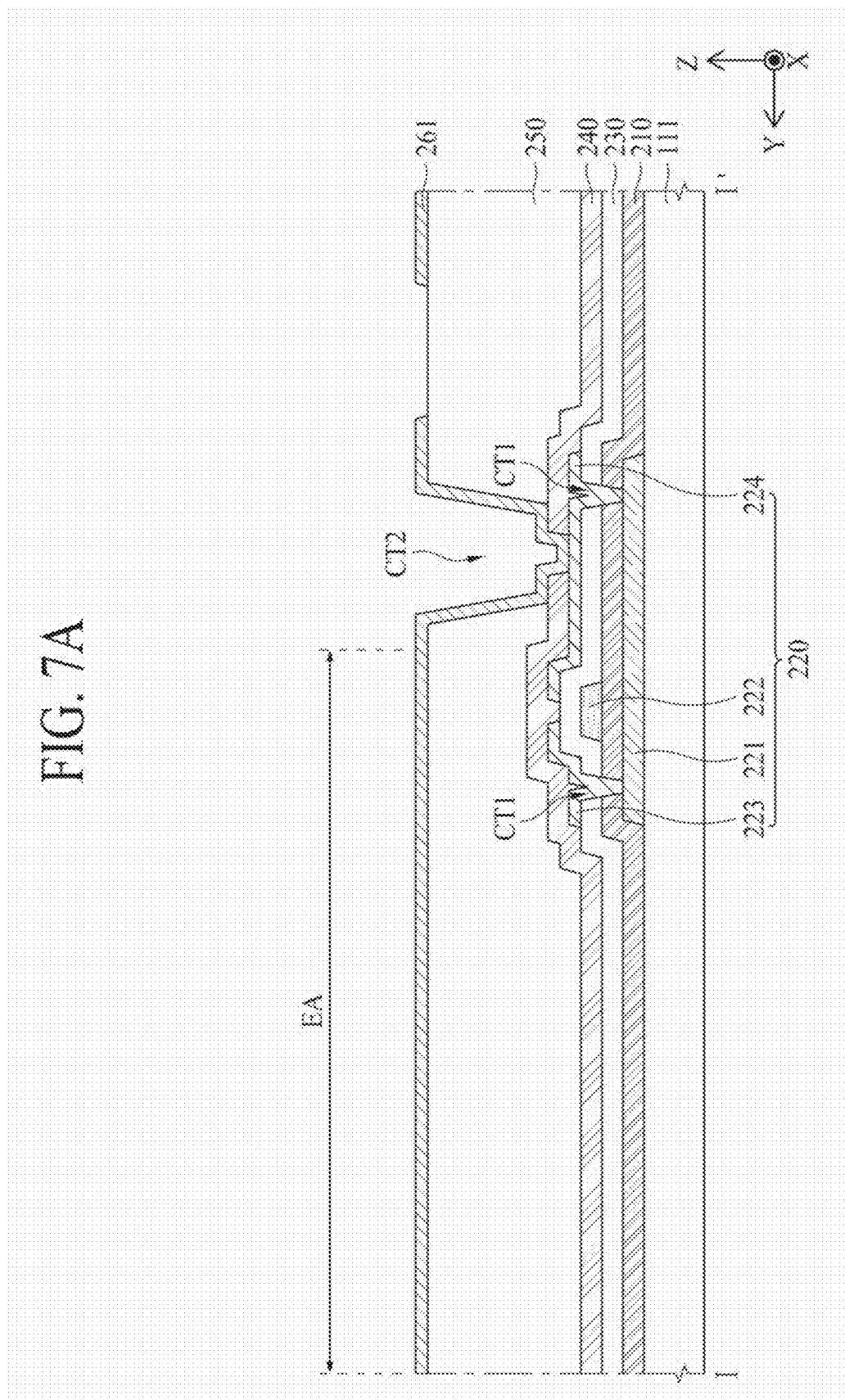

First, as in FIG. 7A, a TFT 220, a planarization layer 250, and a first electrode 261 of an organic light emitting layer 260 may be formed.

In detail, before the TFT 220 is formed, a buffer layer may be formed on a first substrate 111, for protecting the TFT 220 from water penetrating through a substrate 100. The buffer layer may include a plurality of inorganic layers which are alternately stacked, for protecting the TFT 220 and the organic light emitting device 260 from water which penetrates through the first substrate 111 vulnerable to penetration of water. For example, the buffer layer may be formed of a multilayer where one or more inorganic layers of silicon oxide (SiOx), silicon nitride (SiNx), and SiON are alternately stacked. The buffer layer may be formed by using a chemical vapor deposition (CVD) process.

Subsequently, an active layer 221 of the TFT 220 may be formed on the buffer layer. In detail, an active metal layer may be formed all over the buffer layer by using a sputtering process, a metal organic chemical vapor (MOCVD) process, and/or the like. Subsequently, the active layer 221 may be formed by patterning the active metal layer through a mask process using a photoresist pattern. The active layer 211 may be formed of a silicon-based semiconductor material, an oxide-based semiconductor material, and/or the like.

Subsequently, a gate insulation layer 210 may be formed on the active layer 221. The gate insulation layer 210 may be formed of an inorganic layer, for example, silicon oxide (SiOx), silicon nitride (SiNx), or a multilayer thereof.

Subsequently, a gate electrode 222 of the TFT 220 may be formed on the gate insulation layer 210. In detail, a first metal layer may be formed all over the gate insulation layer 210 by using a sputtering process, an MOCVD process, and/or the like. Subsequently, the gate electrode 222 may be formed by patterning the first metal layer through a mask process using a photoresist pattern. The gate electrode 222 may be formed of a single layer or a multilayer which includes one of molybdenum (Mo), chromium (Cr), titanium (Ti), nickel (Ni), neodymium (Nd), and copper (Cu), or an alloy thereof.

Subsequently, an interlayer dielectric 230 may be formed on the gate electrode 222. The interlayer dielectric 230 may be formed of an inorganic layer, for example, SiOx, SiNx, or a multilayer thereof.

Subsequently, a plurality of contact holes CT1 which pass through the gate insulation layer 210 and the interlayer dielectric 230 to expose the active layer 211 may be formed.

Subsequently, a source electrode 223 and a drain electrode 224 of the TFT 220 may be formed on the interlayer dielectric 230. In detail, a second metal layer may be formed all over the interlayer dielectric 230 by using a sputtering process, an MOCVD process, and/or the like. Subsequently, the source electrode 223 and the drain electrode 224 may be formed by patterning the second metal layer through a mask process using a photoresist pattern. Each of the source electrode 223 and the drain electrode 224 may contact the active layer 221 through a corresponding contact hole CT1 which passes through the gate insulation layer 210 and the interlayer dielectric 230. The source electrode 223 and the drain electrode 224 may each be formed of a single layer or a multilayer which includes one of Mo, Cr, Ti, Ni, Nd, and Cu, or an alloy thereof.

Subsequently, a passivation layer 240 may be formed on the source electrode 223 and the drain electrode 224 of the TFT 220. The passivation layer 240 may be formed of an inorganic layer, for example, SiOx, SiNx, or a multilayer thereof. The passivation layer 240 may be formed by using a CVD process.

Subsequently, a planarization layer 250 for planarizing a step height caused by the TFT 220 may be formed on the passivation layer 240. The planarization layer 250 may be formed of an organic layer such as acryl resin, epoxy resin, phenolic resin, polyamide resin, polyimide resin, and/or the like.

Subsequently, a first electrode 261 of the organic light emitting device 260 may be formed on the planarization layer 250. In detail, a third metal layer may be formed all over the planarization layer 250 by using a sputtering process, an MOCVD process, and/or the like. Subsequently, the first electrode 261 may be formed by patterning the third metal layer through a mask process using a photoresist pattern. The first electrode 261 may be connected to the source electrode 223 of the TFT 220 through a contact hole CT2 which passes through the passivation layer 240 and the planarization layer 250. The first electrode 261 may be formed of a metal material, having a high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, and/or the like. (S101 of FIG. 6)

Second, as in FIG. 7B, a bank 270 covering an edge of the first electrode 261 may be formed for dividing a plurality of emissive areas EA.

The bank 270 may be formed of an organic layer such as acryl resin, epoxy resin, phenolic resin, polyamide resin, polyimide resin, and/or the like. (S102 of FIG. 6)

Third, as in FIG. 7C, a photoresist pattern PR may be formed in an area other than an area where a bank hole BH is to be formed. (S103 of FIG. 6)

Figure 7D:
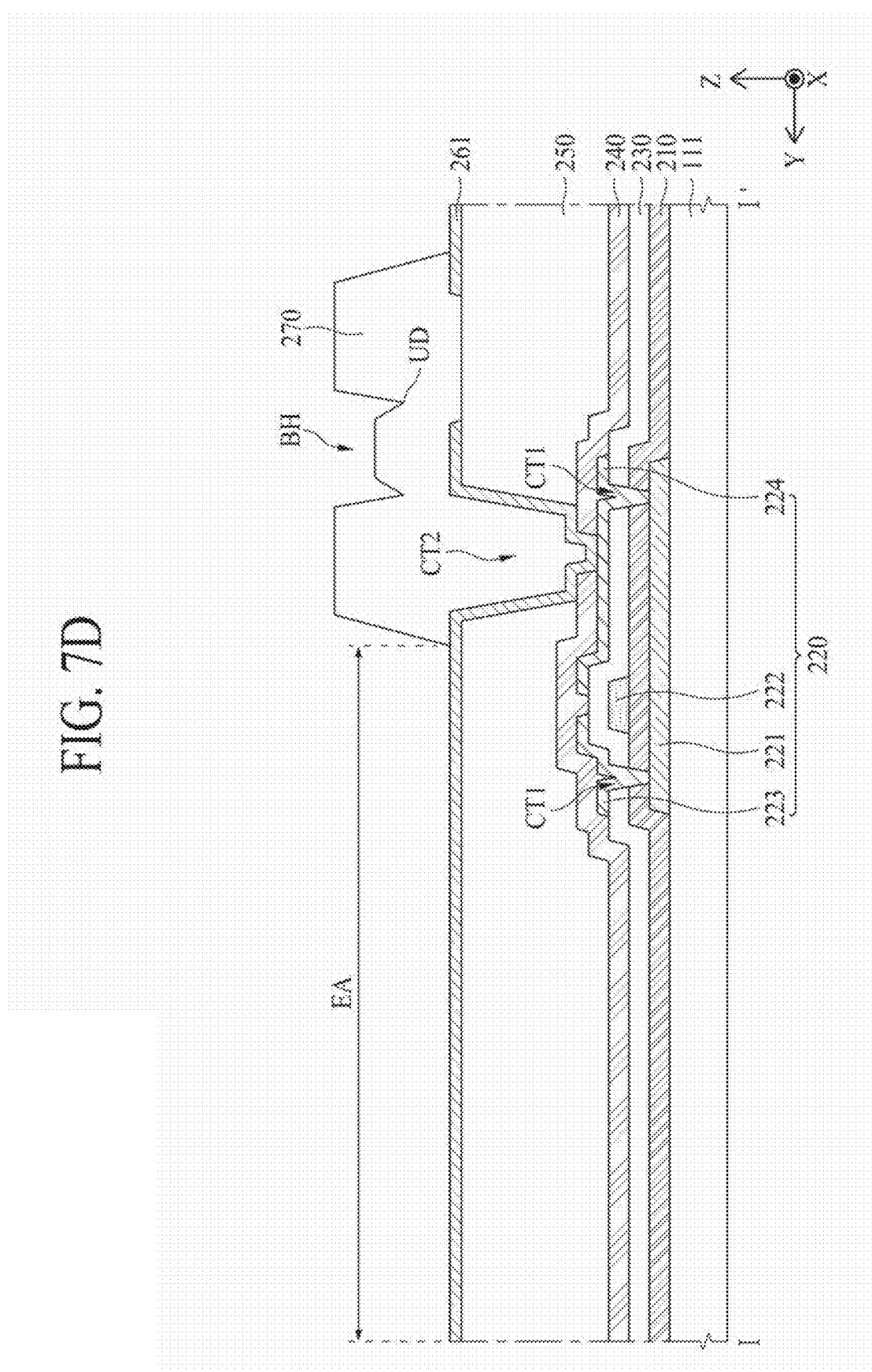

Fourth, as in FIG. 7D, the bank hole BH may be formed by etching the bank 270 which is exposed without being covered by the photoresist pattern PR, and the photoresist pattern PR may be removed.

In detail, as in FIG. 8, the bank hole BH may be formed by using a high frequency inductive coupled plasma apparatus. The high frequency inductive coupled plasma apparatus may include a chamber 1100, a first power supply unit 1200, and a second power supply unit 1300.

The chamber 1100 may include a substrate positioning frame 1110 on which the substrate 111 is positioned, a gas supply unit 1120 that distributes a gas to a portion on the substrate positioning frame 1110, and an antenna 1130 that is disposed over the substrate positioning frame 1110. The gas supply unit 1120 may be configured with a plurality of gas supply units, and the plurality of gas supply units may respectively distribute different gases to a reaction space 1140 of the chamber 1100. For example, a first gas supply unit may distribute a source gas to the reaction space 1140 of the chamber 1110, and a second gas supply unit may distribute a reactant gas to the reaction space 1140 of the chamber 1110. The antenna 1130 may use one coil which is wound in a spiral shape, or may use a plurality of coils which have different diameters, arranged on the same plane in a concentric circle shape, and connected to the first power supply unit 1200 in parallel. The chamber 1100 may further include an exhaust port that exhausts a residual material.

The first power supply unit 1200 may be connected to the antenna 1130 and may supply a first radio frequency (RF) power. The second power supply unit 1300 may be connected to the substrate positioning frame 1110 and may supply a second RF power. For example, the first RF power may be applied at 13.56 MHz, and the second RF power may be applied at 6 MHz.

The high frequency inductive coupled plasma apparatus may distribute a gas to the inside of the chamber 1100 through the gas supply unit 1120, and the first and second power supply units 1200 and 1300 may apply the first and second RF powers, thereby isotropic-etching the first substrate 111 by using a physical impact of ions. The high frequency inductive coupled plasma apparatus may individually control a plasma density and ion energy. As a result, the bank 270 which is exposed without being covered by the photoresist pattern PR may be etched, and thus, the bank hole BH may be formed.

An inclined angle "$\theta_2$" of a sidewall HIP of the bank hole BH may be set greater than an inclined angle "$\theta_1$" of a side BIP of the bank 270. Also, a height H1 of an undercut portion UD may be set lower than a height H2 of the floor HFP. That is, an edge of the bank hole BH may be deeper recessed than a center of the bank hole BH.

Figure 9A:
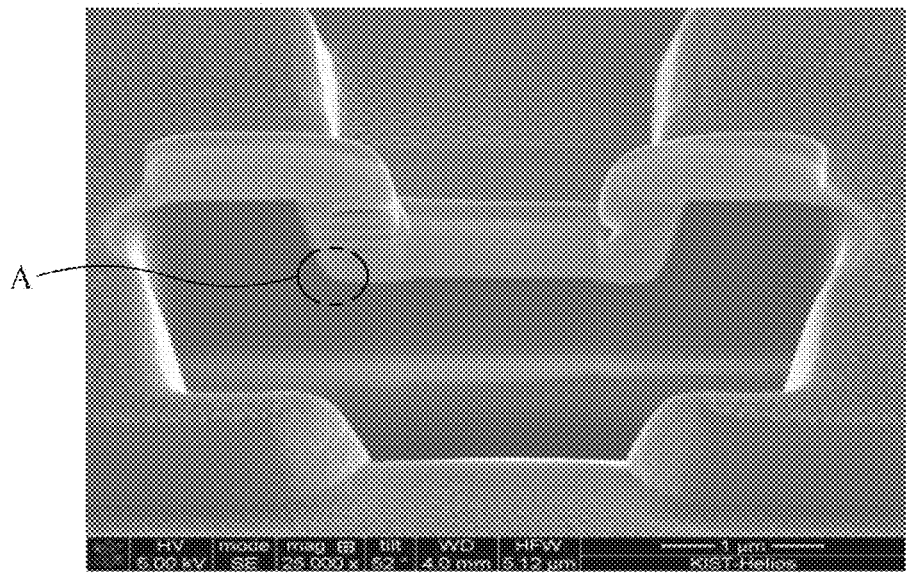
FIGS. 9A and 9B are photomicrographs showing an instance where a bank hole is formed in a plasma etching process and an instance where a bank hole is formed in a high frequency inductive coupled plasma process according to embodiments of the present disclosure.
Figure 9B:
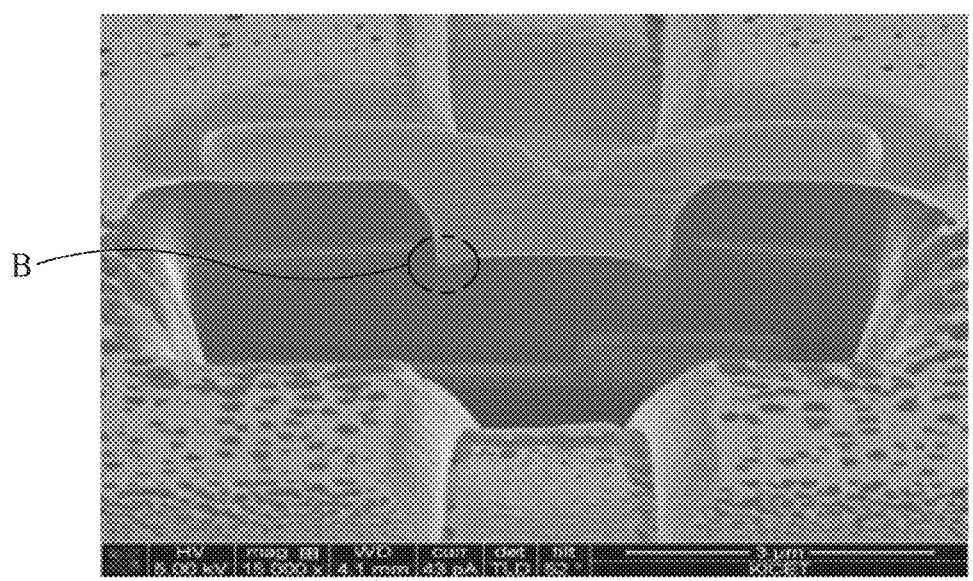

In a plasma etching process, the bank hole BH may be formed through isotropic etching based on a chemical reaction of ions under a condition where an electron density is about $10^9/cm^3$ and pressure is 100 to 1000 mTorr. That is, in the plasma etching process, the isotropic etching may be performed, and thus, as in FIG. 9A, the height H1 of the undercut portion UD is not set lower than the height H2 of the floor HFP.

In a high frequency inductive coupled plasma process, however, the bank hole BH may be formed through isotropic etching based on a physical impact of ions under a condition where an electron density is about $10^{11}/cm^3$ and pressure is 1 to 10 mTorr. That is, in the high frequency inductive coupled plasma process, electric fields may more concentrate on an edge than a center of the bank hole BH. Therefore, in the high frequency inductive coupled plasma process, the bank hole BH may be formed in order for the edge of the bank hole BH to be deeper recessed than the center of the bank hole BH. That is, the height H1 of the undercut portion UD may be set lower than the height H2 of the floor HFP.

Moreover, the gas supplied through the gas supply unit 1120 for forming the bank hole BH may be a mixed gas of $O_2$ and $CF_4$. (S104 of FIG. 6)

Fifth, as in FIG. 7E, an organic light emitting layer 262, a second electrode 263, and an encapsulation layer 280 may be sequentially formed on the first electrode 261 and the bank 270.

In detail, the organic light emitting layer 262 may be a common layer which is formed in the emissive areas EA in common. In this instance, the organic light emitting layer 262 may be a white light emitting layer that emits white light.

In an instance where the organic light emitting layer 262 is a white light emitting layer, the organic light emitting layer 262 may be formed in a tandem structure of two or more stacks. Each of the stacks may include a hole transporting layer, at least one light emitting layer, and an electron transporting layer.

Moreover, a charge generating layer may be formed between adjacent stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generating layer may be an organic layer which is formed by doping a dopant on an organic host material having an ability to transport holes.

The organic light emitting layer 262 may be formed in a deposition process or a solution process, and if the organic light emitting layer 262 is formed in the deposition process, the organic light emitting layer 262 may be formed in an evaporation process. A layer formed in the evaporation process is not good in step coverage characteristic. If the inclined angle "$\theta_2$" of the sidewall HIP of the bank hole BH is set greater than the inclined angle "$\theta_1$" of the side BIP of the bank 270, a thickness of the organic light emitting layer 262 on the sidewall HIP of the bank hole BH may be set thinner than that of the organic light emitting layer 262 on the side BIP of the bank 270.

That is, in an embodiment of the present disclosure, since the bank hole BH corresponding to a recessed portion is formed on the bank 270, a length of a current leakage path which passes through the organic light emitting display layer 262 between adjacent emissive areas EA may be set longer than an instance where the bank hole 270 is not provided. Also, in an embodiment of the present disclosure, since the inclined angle "$\theta_2$" of the sidewall HIP of the bank hole BH is set greater than the inclined angle "$\theta_1$" of the side BIP of the bank 270, a thickness of the organic light emitting layer 262 on the sidewall HIP of the bank hole BH may be set thinner than that of the organic light emitting layer 262 on the side BIP of the bank 270. Accordingly, in an embodiment of the present disclosure, the resistance of the organic light emitting layer 262 may increase, and thus, an adverse influence of a leakage current leaked through the organic light emitting layer 262 is minimized on an adjacent pixel.

Subsequently, a second electrode 263 may be formed on the organic light emitting layer 262. The second electrode 263 may be a common layer which is formed in the emissive areas EA in common. The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer may be formed on the second electrode 263.

The second electrode 263 may be formed in a physical vapor deposition (PVD) process such as a sputtering process. A layer formed in the PVD process such as the sputtering process is good in step coverage characteristic. Accordingly, despite the bank hole BH, the second electrode 263 may be deposited to have a uniform thickness in comparison with the organic light emitting layer 262.

A black bank 271, as in FIG. 5, may be formed on THE second electrode 263. The black bank 271 may be formed to fill a bank hole BH. If the black bank 271 is formed on the second electrode 263, the black matrix 320 may be omitted. The black bank 271 may be formed of an organic layer including a black pigment.

In an embodiment of the present disclosure, the black bank 271 blocks light traveling from one emissive area EA to an adjacent emissive area EA, thereby preventing occurrence of color mixture.

Subsequently, an encapsulation layer 280 may be formed on the second electrode 263. Since the bank hole BH is not filled with the organic light emitting layer 262 and the second electrode 263, the encapsulation layer 280 may be formed to fill the bank hole BH.

The encapsulation layer 280 prevents oxygen or water from penetrating into the organic light emitting layer 262 and the second electrode 263. To this end, the encapsulation layer 280 may include at least one inorganic layer and at least one organic layer.

For example, the encapsulation layer 280 may include a first inorganic layer 281, an organic layer 282, and a second inorganic layer 283. In this instance, the first inorganic layer 281 may be formed to cover the second electrode 263. The organic layer 282 may be formed to cover the first inorganic layer 281. The organic layer 282 may be formed to have a sufficient thickness for preventing particles from penetrating into the organic light emitting layer 262 and the second electrode 263 via the first inorganic layer 281. The second inorganic layer 283 may be formed to cover the organic layer 282.

The first and second inorganic layers 281 and 283 may each be formed of silicon nitride, aluminum nitride, zirconium nitride, titanium nitride, hafnium nitride, tantalum nitride, silicon oxide, aluminum oxide, titanium oxide, and/or or the like. The organic layer 282 may be formed of acryl resin, epoxy resin, phenolic resin, polyamide resin, polyimide resin, and/or the like. (S105 of FIG. 6)

Figure 7F:
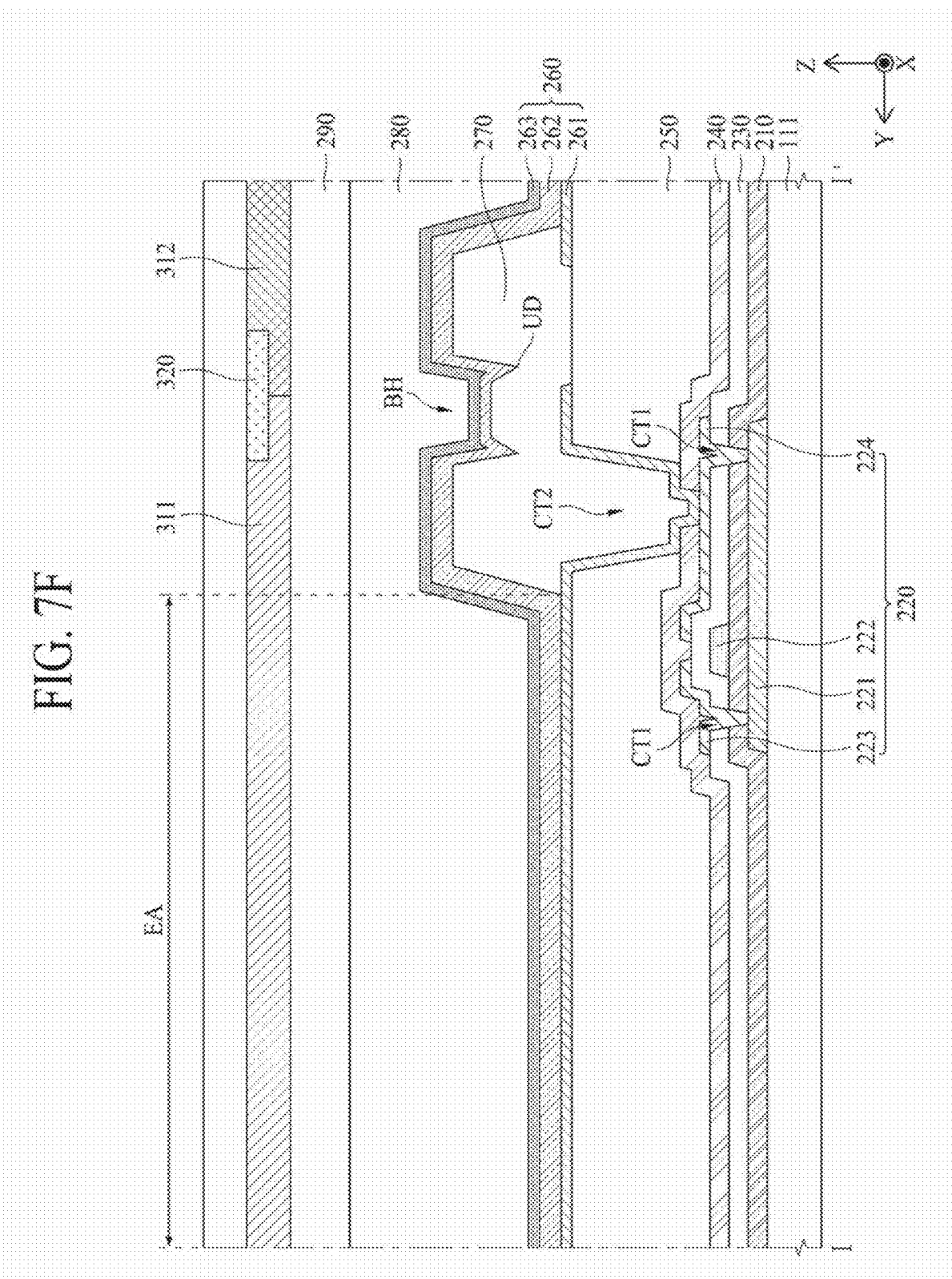

Sixth, as in FIG. 7F, the encapsulation layer 280 of the first substrate 111 may be adhered to the color filters 311 and 312 of the second substrate 112 by using an adhesive layer 290. Therefore, the first substrate 111 may be bonded to the second substrate 112. The adhesive layer 290 may be a transparent adhesive resin. (S106 of FIG. 6)

As described above, in an embodiment of the present disclosure, since the bank hole BH corresponding to a recessed portion is formed on the bank 270, a length of a current leakage path which passes through the organic light emitting display layer 262 between adjacent emissive areas EA may be set longer than an instance where the bank hole 270 is not provided. Also, in an embodiment of the present disclosure, since the inclined angle "$\theta_2$" of the sidewall HIP of the bank hole BH is set greater than the inclined angle "$\theta_1$" of the side BIP of the bank 270, a thickness of the organic light emitting layer 262 on the sidewall HIP of the bank hole BH may be set thinner than that of the organic light emitting layer 262 on the side BIP of the bank 270. Accordingly, in an embodiment of the present disclosure, the resistance of the organic light emitting layer 262 may increase, and thus, an adverse influence of a leakage current leaked through the organic light emitting layer 262 is minimized on an adjacent pixel.

Moreover, in the embodiments of the present disclosure, since the bank hole corresponding to a recessed portion is formed on the bank, a length of a current leakage path which passes through the organic light emitting display layer between adjacent emissive areas may be set longer than an instance where the bank hole is not provided. Also, in the embodiments of the present disclosure, since the inclined angle of the sidewall of the bank hole is set greater than the inclined angle of the side of the bank, a thickness of the organic light emitting layer on the sidewall of the bank hole may be set thinner than that of the organic light emitting layer on the side of the bank. Accordingly, in the embodiments of the present disclosure, the resistance of the organic light emitting layer may increase, and thus, an adverse influence of a leakage current leaked through the organic light emitting layer is minimized on an adjacent pixel.

Moreover, in the embodiments of the present disclosure, the black bank may be formed on the second electrode to fill the bank hole. As a result, in the embodiments of the present disclosure, light emitted from one emissive area cannot travel to an adjacent emissive area, thereby preventing occurrence of color mixture.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display device comprising:
   a first electrode on a substrate;
   a bank covering a portion of the first electrode;
   a bank hole provided in the bank;
   an organic light emitting layer on the first electrode and the bank; and
   a second electrode on the organic light emitting layer,
   wherein the bank hole includes a sidewall, a floor, and an undercut portion between the sidewall and the floor.

2. The organic light emitting display device of claim 1, wherein a thickness of the organic light emitting layer on a side of the bank is thicker than a thickness of the organic light emitting layer on the sidewall of the bank hole.

3. The organic light emitting display device of claim 1, wherein an inclined angle of a side of the bank is less than an inclined angle of the sidewall of the bank hole.

4. The organic light emitting display device of claim 1, wherein a height of the undercut portion of the bank hole is lower than a height of the floor of the bank hole.

5. The organic light emitting display device of claim 1, wherein the organic light emitting layer and the second electrode are provided in the bank hole.

6. The organic light emitting display device of claim 1, further comprising:
   an encapsulation layer on the second electrode, the encapsulation layer being filled into the bank hole.

7. The organic light emitting display device of claim 1, further comprising:
   a black bank on the second electrode, the black bank being filled into the bank hole.

8. The organic light emitting display device of claim 1, wherein
   an area where the first electrode, the organic light emitting layer, and the second electrode are sequentially stacked is defined as an emissive area, and
   the bank hole is disposed between adjacent emissive areas.

9. The organic light emitting display device of claim 8, wherein the bank divides the emissive area.

10. An organic light emitting display device comprising:
    a first substrate;
    a plurality of pixels on the first substrate, each pixel containing an emissive area;
    a plurality of banks respectively surrounding the emissive areas of the plurality of pixels;
    a bank hole provided in the plurality of banks, and disposed between adjacent emissive areas; and
    an organic light emitting layer on each bank,
    wherein the bank hole includes a sidewall, a floor, and an undercut portion between the sidewall and the floor.

11. The organic light emitting display device of claim 10, further comprising:
    a second substrate facing the first substrate; and
    a plurality of color filters and a black matrix on the second substrate,
    wherein the bank hole is aligned with the black matrix.

12. The organic light emitting display device of claim 10, wherein a thickness of the organic light emitting layer on a side of each bank is thicker than a thickness of the organic light emitting layer on the sidewall of the bank hole.

13. The organic light emitting display device of claim 10, wherein an inclined angle of a side of each bank is less than an inclined angle of the sidewall of the bank hole.

14. The organic light emitting display device of claim 10, wherein a height of the undercut portion of the bank hole is lower than a height of the floor of the bank hole.

15. The organic light emitting display device of claim 10, wherein the organic light emitting layer is provided in the bank hole.

16. The organic light emitting display device of claim 10, further comprising:
    at least one of encapsulation layer and a black bank filling the bank hole.

* * * * *